(12) United States Patent
Burnham et al.

(10) Patent No.: US 6,780,720 B2
(45) Date of Patent: Aug. 24, 2004

(54) METHOD FOR FABRICATING A NITRIDED SILICON-OXIDE GATE DIELECTRIC

(75) Inventors: Jay S. Burnham, Fletcher, VT (US); Anthony I. Chou, Yorktown Heights, NY (US); Toshiharu Furukawa, Essex Junction, VT (US); Margaret L. Gibson, Underhill, VT (US); James S. Nakos, Essex, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/187,572

(22) Filed: Jul. 1, 2002

(65) Prior Publication Data

US 2004/0002226 A1 Jan. 1, 2004

(51) Int. Cl.[7] .................. H01L 21/336; H01L 21/31; H01L 21/469
(52) U.S. Cl. .................. 438/287; 438/301; 438/775; 438/786; 438/787; 438/776
(58) Field of Search ............... 438/301, 775, 438/786, 287, 787, 776

(56) References Cited

U.S. PATENT DOCUMENTS

| | | | |
|---|---|---|---|
| 4,621,277 A | * 11/1986 | Ito et al. ............... 257/313 |
| 4,623,912 A | 11/1986 | Chang et al. | |
| 4,913,929 A | 4/1990 | Moslehi et al. | |
| 5,445,999 A | 8/1995 | Thakur et al. | |
| 5,455,204 A | 10/1995 | Dobuzinsky et al. | |
| 5,834,353 A | * 11/1998 | Wu ............... 438/287 |
| 5,861,651 A | * 1/1999 | Brasen et al. ......... 257/411 |
| 5,891,809 A | 4/1999 | Chau et al. | |
| 5,939,763 A | 8/1999 | Hao et al. | |
| 6,013,553 A | 1/2000 | Wallace et al. | |
| 6,048,769 A | 4/2000 | Chau | |
| 6,060,369 A | 5/2000 | Gardner et al. | |
| 6,060,403 A | 5/2000 | Yasuda et al. | |
| 6,087,236 A | * 7/2000 | Chau et al. ........... 438/301 |
| 6,096,614 A | 8/2000 | Wu | |
| 6,184,110 B1 | 2/2001 | Ono et al. | |
| 6,228,779 B1 | 5/2001 | Bloom et al. | |
| 6,239,044 B1 | 5/2001 | Kashiwagi et al. | |
| 6,245,689 B1 | 6/2001 | Hao et al. | |
| 6,248,628 B1 | 6/2001 | Halliyal et al. | |
| 6,251,761 B1 | * 6/2001 | Rodder et al. ........ 438/591 |
| 6,265,327 B1 | 7/2001 | Kobayashi et al. | |
| 6,294,819 B1 | 9/2001 | Sun | |
| 6,306,741 B1 | 10/2001 | Lee et al. | |
| 6,548,366 B2 | * 4/2003 | Niimi et al. .......... 438/384 |
| 6,566,205 B1 | * 5/2003 | Yu et al. .............. 438/287 |

FOREIGN PATENT DOCUMENTS

| JP | 2018934 | 1/1990 |
|---|---|---|
| JP | 2000228522 | 8/2000 |

\* cited by examiner

Primary Examiner—John F. Niebling
Assistant Examiner—Ron Pompey
(74) Attorney, Agent, or Firm—Schmeiser, Olsen & Watts; William D. Sabo

(57) ABSTRACT

A method of fabricating a gate dielectric layer. The method comprises: providing a substrate; forming a silicon dioxide layer on a top surface of the substrate; exposing the silicon dioxide layer to a plasma nitridation to convert the silicon dioxide layer into a silicon oxynitride layer; and performing a spiked rapid thermal anneal of the silicon oxynitride layer.

22 Claims, 8 Drawing Sheets

METHOD FOR FABRICATING A NITRIDED SILICON-OXIDE GATE DIELECTRIC

FIELD OF THE INVENTION

The present invention relates to the manufacture of semiconductor devices; more specifically, it relates to a method of fabricating a nitrided silicon-oxide gate dielectric.

BACKGROUND OF THE INVENTION

The trend in integrated circuits is toward higher performance, higher speed and lower cost. Correspondingly, device dimensions and element sizes are shrinking and gate dielectrics must scale accordingly. As physical gate dielectric thickness has decreased, the need for a higher dielectric constant and less leaky gate dielectric has arisen. In advanced metal oxide semiconductor field effect transistors (MOSFETs) silicon oxynitride ($SiO_xN_y$) layers are used as a gate dielectric. MOSFET transistors include a channel region formed in a silicon substrate, an N or P doped polysilicon gate formed on top of a thin gate dielectric layer and aligned over the channel region and source/drain regions formed in the silicon substrate on either side of the channel region.

However, there are several problems associated with $SiOxN_y$ layers that affect the performance of devices having a $SiO_xN_y$ gate dielectric. These problems are a result of the processes used to fabricate the $SiO_xN_y$ layer and the distribution of nitrogen in the layer. SiOxNy layers fabricated using conventional plasma nitridation processes have poor reliability as a result of low time dependent dielectric breakdown ($T_{BD}$) and charge-to-breakdown ($Q_{BD}$). The degradation in reliability is caused by plasma induced dangling bonds in the dielectric and at the dielectric-silicon interface. Further, the nitrogen concentration in $SiO_xN_y$ layers fabricated using conventional plasma and thermal nitridation processes is not uniformly distributed throughout the layer but is concentrated at the $SiO_xN_y$/Si interface causing large threshold voltage ($V_T$) shifts; the shifts of p-channel field effect transistors (PFETs) being larger than that of N-channel field effect transistors (NFETs). Both mechanisms described above will cause a degradation in the channel mobility. Both mechanisms described above will also cause an increase in negative bias temperature instability (NBTI) which induces $V_T$ and frequency shifts after stressing. Additionally, the relative lack of nitrogen near the surface of conventional $SiO_xN_y$ layers results in increased boron penetration from the gate electrode (in PFETs) into the $SiO_xN_y$ layer which can degrade Tbd and Qbd as well as influence across-wafer $V_T$ uniformity.

Therefore, there is a need for a method of fabricating a $SiO_xN_y$ layer having a relatively uniform nitrogen concentration throughout its thickness, high mobility and high Tbd and Qbd, while forming a layer with realtively high nitrogen content to lower leakage current through the gate dielectric when the device is turned off.

SUMMARY OF THE INVENTION

A first aspect of the present invention is A method of fabricating a gate dielectric layer comprising: providing a substrate; forming a silicon dioxide layer on a top surface of the substrate; exposing the silicon dioxide layer to a plasma nitridation to convert the silicon dioxide layer into a silicon oxynitride layer; and performing a spiked rapid thermal anneal of the silicon oxynitride layer.

A second aspect of the present invention is a method of fabricating a MOSFET, comprising: providing a silicon substrate; forming a silicon dioxide layer on a top surface of the silicon substrate; exposing the silicon dioxide layer to a plasma nitridation to convert the silicon dioxide layer to a silicon oxynitride layer; performing a spiked rapid thermal anneal of the silicon oxynitride layer; forming a polysilicon gate on the annealed silicon oxynitride layer aligned over a channel region in the silicon substrate; and forming source/drain regions in the silicon substrate, the source drain regions aligned to the polysilicon gate.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The terms nitrided silicon dioxide (nitrided $SiO_2$) and silicon oxynitride ($SiO_xN_y$) are equivalent terms for the purposes of the present invention. The scope of $SiO_xN_y$ includes all combinations of integers x and y (or fractions thereof) at which $SiO_xN_y$ is stable. A spike rapid thermal anneal (RTA), for the purposes of the present invention, is defined as an anneal wherein the time at maximum temperature (the spike temperature) is about 60 seconds or less.

Figure 1:
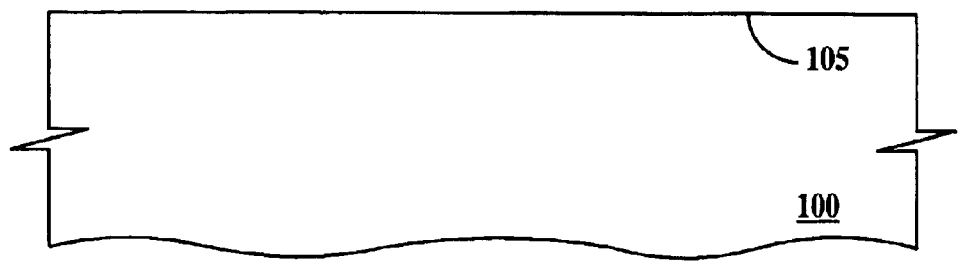
FIGS. 1 through 3 are partial cross-sectional views illustrating fabrication of a nitrided gate dielectric layer according to the present invention.
Figure 2:
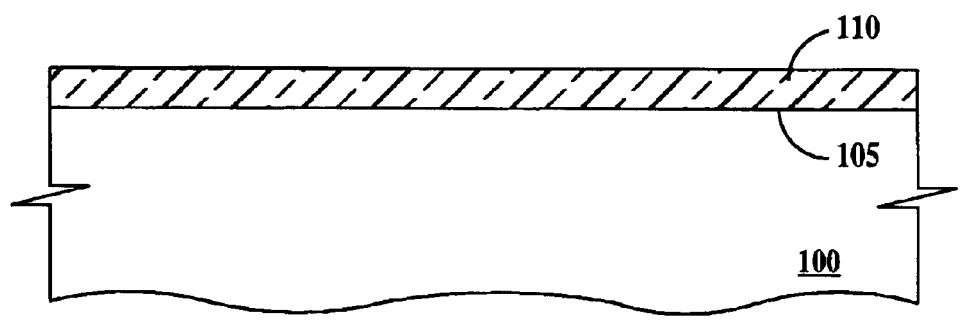
Figure 3:
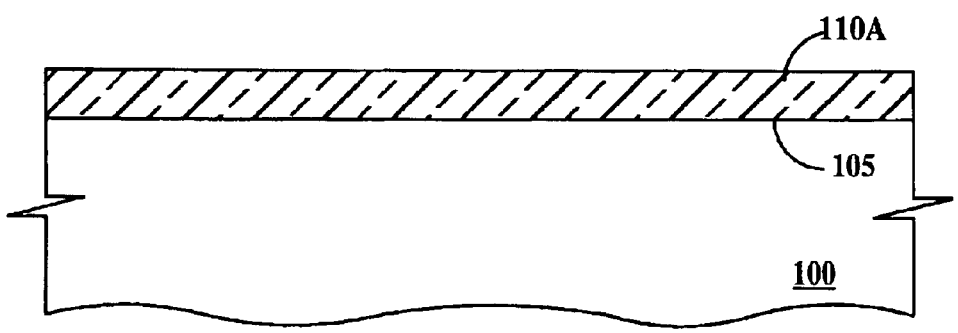

FIGS. 1 through 3 are partial cross-sectional views illustrating fabrication of a nitrided gate dielectric layer according to the present invention. In FIG. 1 a substrate 100 having a top surface 105 is provided. Substrate 100 may be an intrinsic, N-type or P-type bulk silicon substrate or an undoped or an intrinsic, N-type or P-type silicon on insulator (SOI) substrate or a sapphire substrate or a ruby substrate.

In FIG. 2, a base $SiO_2$ layer 110 is formed on top surface 105 of substrate 110. Prior to formation of base $SiO_2$ layer 110 on surface 105, the surface is cleaned by any one of a number of cleaning processes well known in the art. For example, surface 105 may be cleaned using a buffered hydrofluoric acid (BHF) clean followed by an $NH_4OH$ clean followed by an HCl clean. If substrate 100 is a bulk silicon substrate or an SOI substrate, base $SiO_2$ layer 110 may be formed, in a first example, by a thermal oxidation in a furnace in an oxygen-containing atmosphere at about 600 to 800° C. for about 0.5 to 30 minutes. In a second example, base $SiO_2$ layer 110 may be formed by a rapid thermal oxidation (RTO) in an oxygen-containing atmosphere at about 800 to 1000° C. for about 5 to 60 seconds. In a third example, base $SiO_2$ layer 110 may be formed by thermal oxidation in a gaseous environment containing oxygen and either nitric oxide (NO) or nitrous oxide ($N_2O$) such that base $SiO_2$ layer 110 contains from 0 to 5% atomic percent nitrogen. If substrate 100 is a ruby or sapphire substrate, base $SiO_2$ layer 110 may be formed by a deposition in a chemical vapor deposition (CVD) tool and dielectric layer may be a tetraethoxysilane (TEOS) oxide. TEOS may also be used for a bulk silicon or SOI substrate. TEOS may also be used for bulk silicon or SOI substrates. In one example, base $SiO_2$ layer 110 is about 10 to 20 Å thick.

In FIG. 3, a decoupled plasma nitridation (DPN) process followed by a spike RTA process is performed to convert base $SiO_2$ layer 110 (see FIG. 2) to a nitrided $SiO_2$ ($SiO_xN_y$) layer 110A. The plasma nitridation process is described below in reference to FIGS. 6 and 7 and the spike RTA process is described below in reference to FIGS. 6, 8 and 9. $SiO_xN_y$ layer 110A is about 3 Å thicker than base $SiO_2$ layer 110 (see FIG. 2) was and contains about 5 to 15% nitrogen atoms relatively distributed throughout the $SiO_xN_y$ layer as illustrated in FIG. 10 and described below. In one example, $SiO_xN_y$ layer 110A is about 13 to 23 Å thick.

Figure 4:
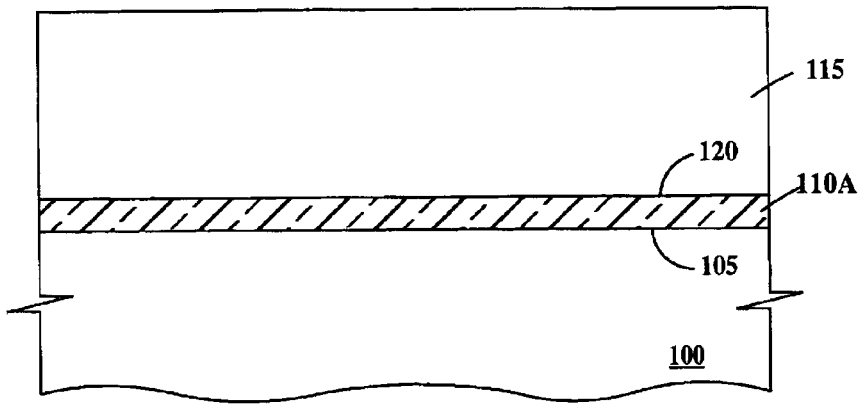
FIGS. 4 and 5 are partial cross-sectional views illustrating fabrication of a MOSFET according to the present invention.
Figure 5:
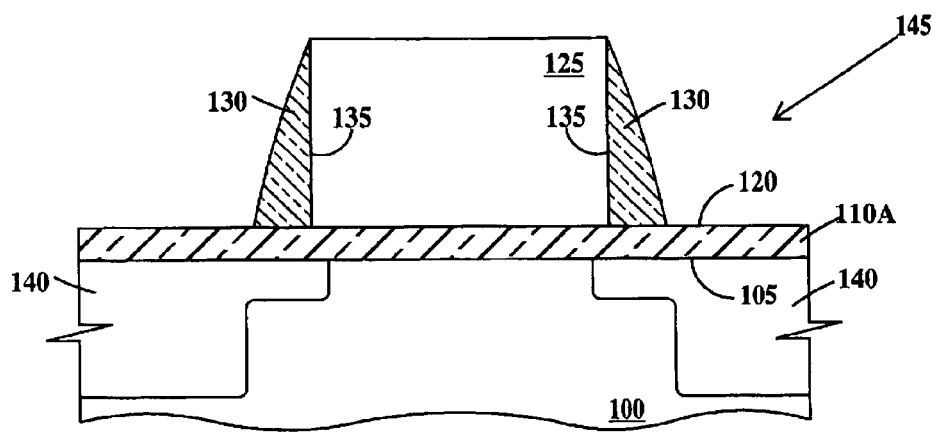

FIGS. 4 and 5 are partial cross-sectional views illustrating fabrication of a MOSFET according to the present invention. FIG. 4 continues from FIG. 3. In FIG. 4, a polysilicon layer 115 is formed on a top surface 120 of $SiO_xN_y$ layer 110A. Polysilicon layer 115 may be formed using one of a number of deposition processes well known in the art, such as low-pressure chemical vapor deposition (LPCVD) or rapid thermal chemical vapor deposition (RTCVD). Polysilicon layer 115 may be undoped or doped N-type or P-type. In one example, polysilicon layer 115 is 1000 to 2000 Å thick.

In FIG. 5, polysilicon layer 115 (see FIG. 4) is etched; for example, by a reactive ion etch (RIE) processes to form a gate 125. Spacers 130 are formed on sidewalls 135 of gate 125. Formation of source/drains 140 (typically by one or more ion-implantation processes) essentially completes fabrication of MOSFET 145, $SiO_xN_y$ layer 110A being the gate dielectric of the MOSFET. If polysilicon layer 115 (see FIG. 4) was not doped during deposition, gate 125 may be doped N-type or P-type after spacer formation by ion implantation in conjunction with the formation of source/drains 140 or as a separate step.

Figure 6:
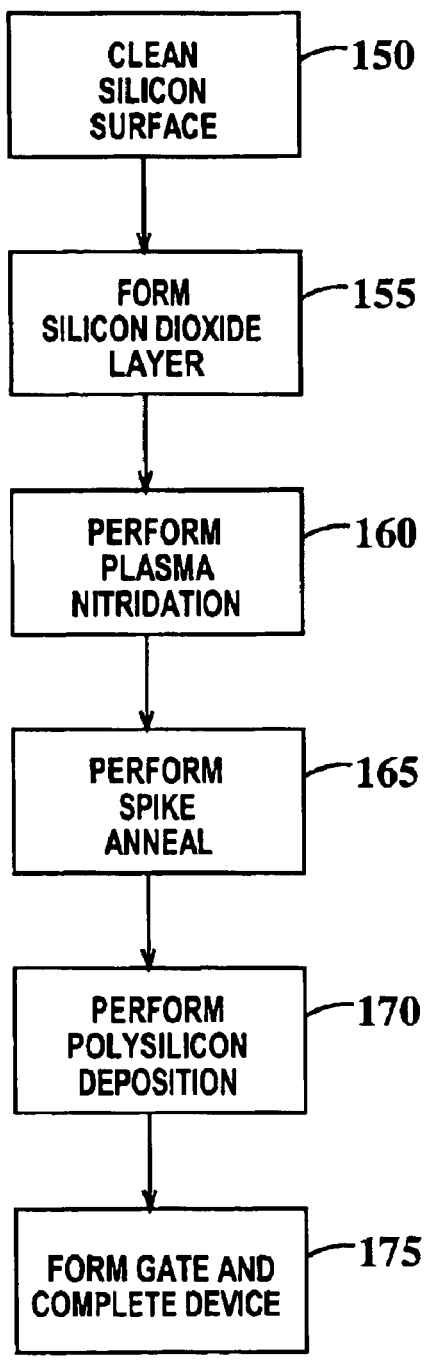
FIG. 6 is a flowchart of the process steps for fabricating a dielectric layer and the MOSFET illustrated in FIGS. 1 through 4 according to the present invention.

FIG. 6 is a flowchart of the process steps for fabricating a dielectric layer and the MOSFET illustrated in FIGS. 1 through 5 according to the present invention. A silicon substrate will be used as an example. In step 150, the surface of the silicon substrate is cleaned by any one of a number of cleaning processes well known in the art. In a first example, silicon surface 105 may be cleaned using a buffered hydrofluoric acid (BHF) clean followed by an $NH_4OH$ clean followed by an HCl clean. Alternatively, in a second example, the silicon surface may be cleaned using BHF followed by an $O_3$ clean, followed by a dry HCl clean.

In step 155, a base $SiO_2$ layer is formed, for example, by a thermal oxidation in a furnace in an oxygen-containing atmosphere at about 600 to 800° C. for about 0.5 to 30 minutes or by a RTO in an oxygen-containing atmosphere at about 800 to 1000° C. for about 5 to 60 seconds. The base $SiO_2$ layer is about 10 to 20 Å thick.

In step 160 a decoupled plasma nitridation process is performed. The decoupled plasma nitridation processes is tuned for the thickness of the base $SiO_2$ used. A general example and three specific examples are given, for 10 to 20 Å, 12 Å, 15 Å and 18 Å of base $SiO_2$ respectively, in Chart I.

CHART I

| PARAMETER | General Example | Specific Example 1 | Specific Example 2 | Specific Example 3 |
| --- | --- | --- | --- | --- |
| Base $SiO_2$ | 10–20 Å | 12 Å | 15 Å | 18 Å |
| $He/N_2$ MIX | 50–95% He | 95% He | 95% He | 95% He |
| He Flow (sccm) | 300–3000 | 475 | 475 | 475 |
| $N_2$ Flow (sccm) | 20–200 | 25 | 25 | 25 |
| Pressure (torr) | 50–125 | 75–125 | 75–125 | 75–125 |
| Power (watts) | 50–200 | 100 | 100 | 100 |
| Time (sec) | 5–60 | 20 | 30 | 40 |
| Substrate Bias (v) | 0 | 0 | 0 | 0 |
| Wafer Temp (° C.) | 0–200 | 20 | 20 | 20 |
| Chamber Temp (° C.) | 0–200 | 65 | 65 | 65 |
| $SiO_xN_y$ | 13–23 Å | 15 Å | 18 Å | 21 Å |

In the examples of Chart I, decoupled plasma nitridation time is used, though any of the parameters, especially $N_2$ flow, He flow and power may be used to tune the process to the base $SiO_2$ thickness. The gas mix listed in Chart I is a $He/N_2$ mix. Other inert gases such as Ne, Ar, Kr and Xe may be used in place of He. The present invention is also applicable to a $SiO_2$ layer thinner than 10 Å.

In step 165, a spike RTA is performed. A spike anneal is used to increase the mobility without driving the nitrogen to the $SiO_2$/Si interface. A general example and one specific example are given, for 10 to 20 Å and 15 Å of base $SiO_2$ respectively, in Chart II.

CHART II

| PARAMETER | General Example | Specific Example 1 |
| --- | --- | --- |
| Base $SiO_2$ | 10–20 Å | 15 Å |
| Spike Temperature (° C.) | 800–1300 | 1050 |
| Pressure (torr) | 1–780 | 780 |
| $N_2$ Flow (liters/min) | 1–10 | 10 |
| $O_2$ Flow (sccm) | 0–1000 | 0 |
| Spike Time (sec) | 0–60 | 0 |

The Spike Temperature in Chart II is the maximum temperature reached during the spike anneal. The use of $O_2$ will increase the thickness of the completed $SiO_xN_y$ layer more than if no $O_2$ is used during the anneal process. In one example, the average concentration of nitrogen in the completed $SiO_xN_y$ layer is about 1E21 to 5E21 atm/$cm^3$ and the equivalent nitrogen dose is about 7E14 to 8E14 atm/$cm^2$. This completes fabrication of a nitrided $SiO_2$ dielectric. The following steps use the nitrided $SiO_2$ dielectric as a gate dielectric for a MOSFET.

In step 170, a polysilicon layer is formed over the nitrided $SiO_2$ using one of a number of deposition processes well known in the art, such as LPCVD or RTCVD. The polysilicon layer may be undoped or doped N-type of P-type. In one example, the polysilicon layer is 1000 to 2000 Å thick.

In step 175, the MOSFET is essentially completed. The polysilicon layer is etched; for example, by a RIE processes to form a gate, spacers are formed on sidewalls of the gate and source/drains are formed in the substrate on either side of the gate (typically by one or more ion-implantation processes). The $SiO_xN_y$ layer is the gate dielectric of the MOSFET. If the polysilicon layer was not doped during deposition, the gate may be doped N-type or P-type after spacer formation by ion implantation in conjunction with the formation of the source/drains or as a separate step.

Figure 7:
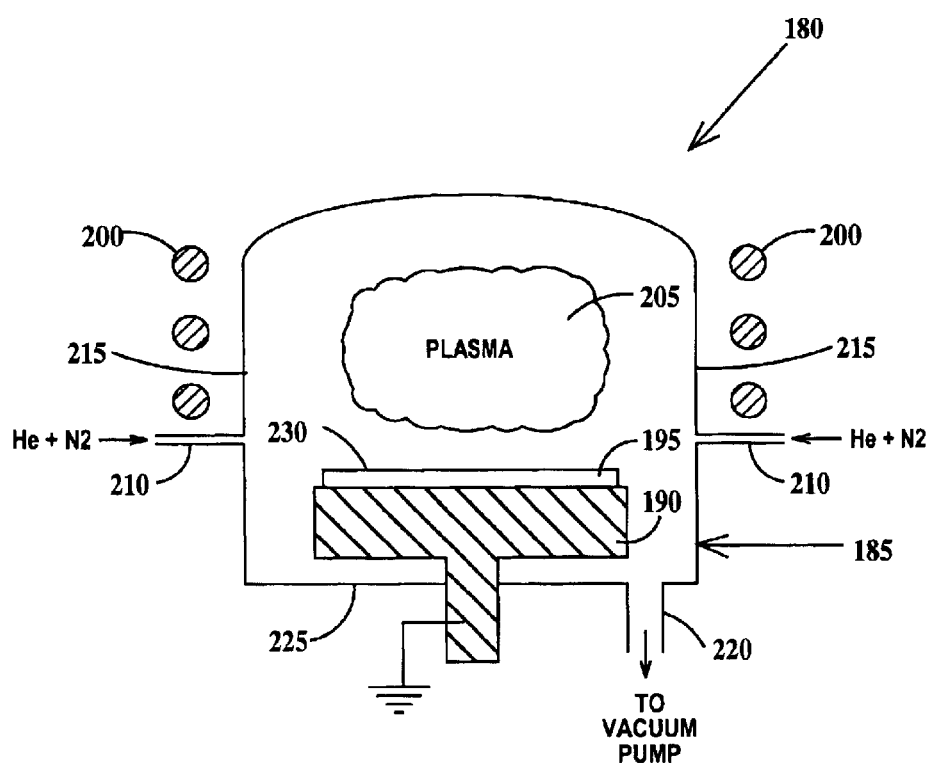
FIG. 7 is a schematic illustration of a decoupled plasma system for performing a nitridation step according to the present invention.

FIG. 7 is a schematic illustration of a decoupled plasma system for performing a nitridation process according to the present invention. In FIG. 7, decoupled plasma tool 180 includes a chamber 185 and a wafer chuck 190 (for holding a wafer 195) within the chamber. Radio frequency (RF) coils 200 for generating a plasma 205 surround chamber 185. Gases for plasma 205 are supplied by inlets 210 in sidewalls 215 of chamber 185. Chamber 185 also includes a vacuum port 220 in a surface 225 of the chamber.

In use, wafer 195 having a base $SiO_2$ layer (not shown) on a top surface 230 of the wafer is placed into chamber 185 from a transfer chamber (not shown), a pre-selected gas mixture (in the present example, $He/N_2$) at a pre-selected flow rate is introduced into the chamber via inlets 210 and the chamber maintained at a pre-selected pressure via a pump attached to vacuum port 220. A pre-selected wattage of RF power is impressed on RF coils 200 to energize and maintain plasma 205. After a pre-selected time, the RF power is turned off extinguishing plasma 205, the gas flow is turned off and chamber 185 is brought up to transfer chamber pressure.

One example of decoupled plasma system is an AME 5200 DPS system manufactured by Applied Materials Corp, Santa Clara, Calif.

Figure 8:
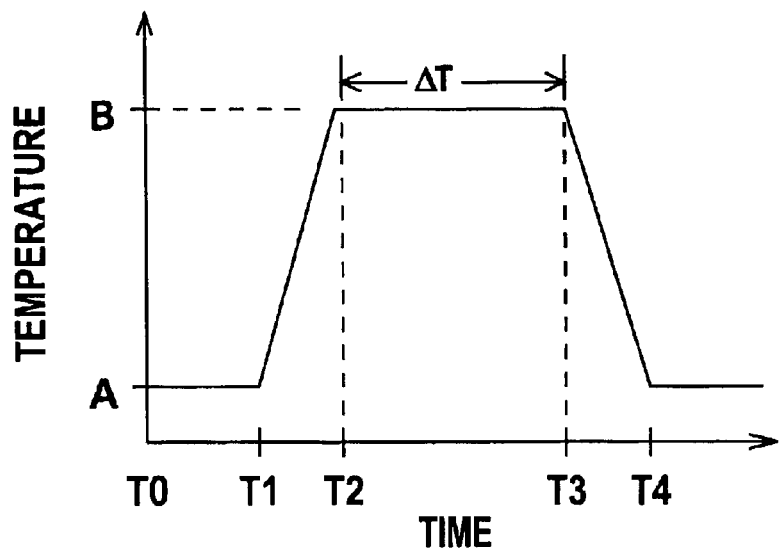
FIGS. 8 and 9 are plots of temperature versus time illustrating a spike anneal process according to the present invention.
Figure 9:
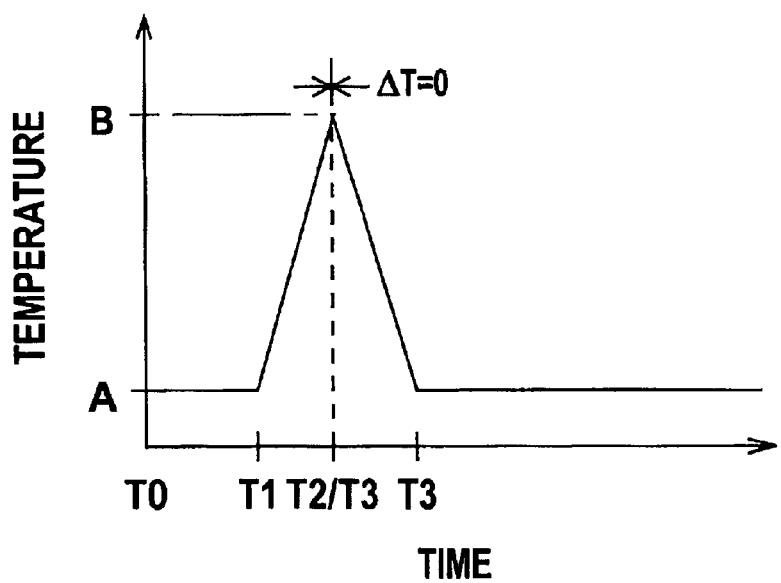
Figure 10:
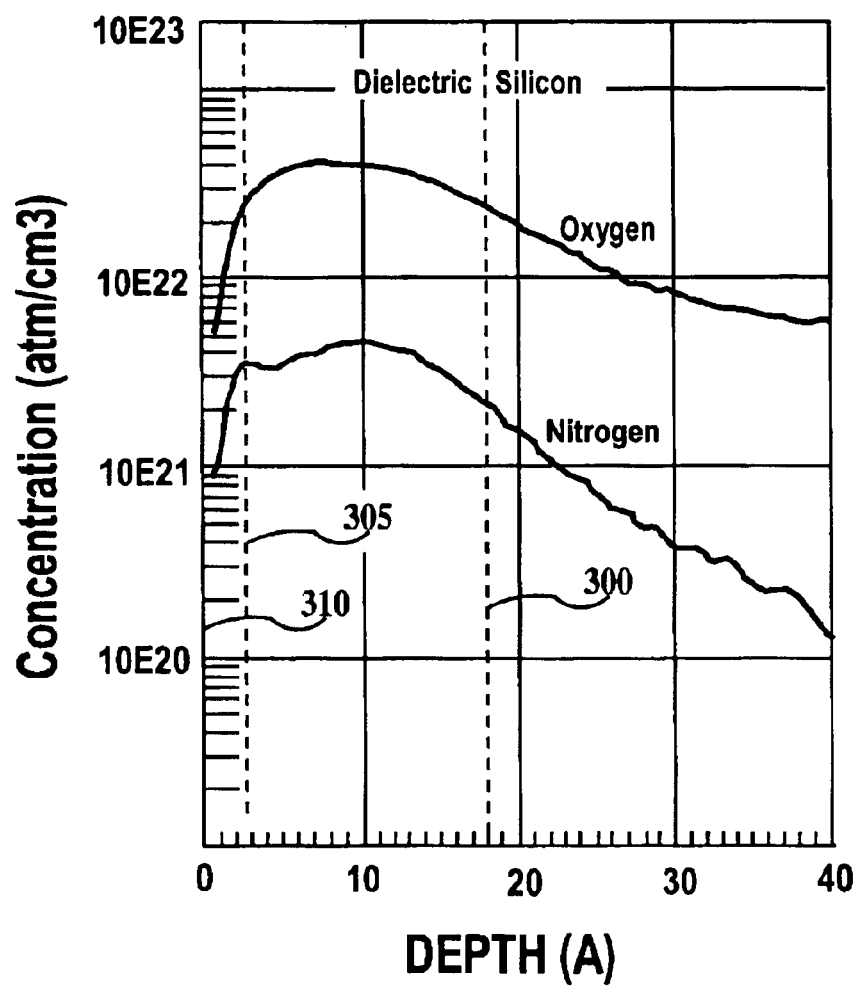
FIG. 10 is a secondary ion mass microscopy (SIMs) profile of a gate dielectric fabricated according to the present invention.

FIGS. 8 and 9 are plots of temperature versus time illustrating a spike anneal process according to the present invention. In FIG. 8, a wafer is introduced into the RTA tool at a base temperature "A" and a time "T0." Between time "T1" and time "T2" the wafer temperature is ramped up from base temperature "A" to maximum spike temperature "B." The slope of the temperature up ramp ($S_U$) is given by $S_U=(B-A)/(T2-T1)$. Between time "T2" and time "T3" the wafer temperature is maintained at maximum temperature "B." The time ($\Delta T$) at maximum temperature is given by $\Delta T=(T3-T2)$. Between time "T3" and time "T4" the wafer temperature is ramped down from maximum temperature "B" to base temperature "A." The slope of the temperature down ramp ($S_D$) is given by $S_D=(A-B)/(T4-T3)$. If "A," "B," $S_U$ and $S_D$ are held constant and "T3" is set equal to "T2" so DT=0, then the plot of temperature versus time illustrated in FIG. 9 results. In FIG. 9, the wafer is raised to a maximum temperature "B" and is held at the maximum temperature "B" for zero time. FIG. 9 illustrates the "sharpest" spike anneal possible. In one example, base temperature "A" is about 200 to 400° C., maximum temperature "B" is about 1050° C., the slope of the up temperature ramp "$S_U$" is about 75° C./sec, the slope of the down temperature ramp "$S_D$" is about −75° C./sec and the time at maximum temperature "DT" is about 0 to 60 seconds.

FIG. 10 is a secondary ion mass microscopy (SIMs) profile of a gate dielectric fabricated according to the present invention. The base $SiO_2$ was 15 Å thick and the resultant $SiO_xN_y$ layer is 18 Å thick. In FIG. 10, the $SiO_xN_y/Si$ interface 300 occurs at 18 Å depth. In FIG. 10, the oxygen concentration ranges from about 2E22 atm/cm³ at a point 305 which is 3 Å from the true surface 310 of the $SiO_xN_y$ layer to a maximum of about 3E22 atm/cm³ at about 7 Å depth to about 2E22 atm/cm³ at the $SiO_xN_y/Si$ interface 300. In FIG. 10, the nitrogen concentration ranges from about 2E21 atm/cm³ at point 305 of the $SiO_xN_y$ layer to a maximum of about 4E21 atm/cm³ at 10 Å depth to about 1 E21 atm/cm³ at the $SiO_xN_y/Si$ interface 300. In other SIMs profiles the nitrogen concentration reaches about 5E21 atm/cm² and the oxygen concentration 5E22 atm/cm³. The nitrogen is not concentrated near the $SiO_xN_y/Si$ interface 300 but relatively uniformly distributed within the $SiO_xN_y$ layer at a concentration of about 1E21 atm/cm³ to 3.5 E21 atm/cm³ except for the first 3 Å of depth where the SIMs data is not reliable. The present invention produces a $SiO_xN_y$ layer having a relatively uniform nitrogen concentration throughout its thickness which results devices having a lower $V_T$ shift compared to devices having a conventional $SiO_xN_y$ layers having high nitrogen concentrations near the $SiO_xN_y/Si$ interface 300.

Figure 11:
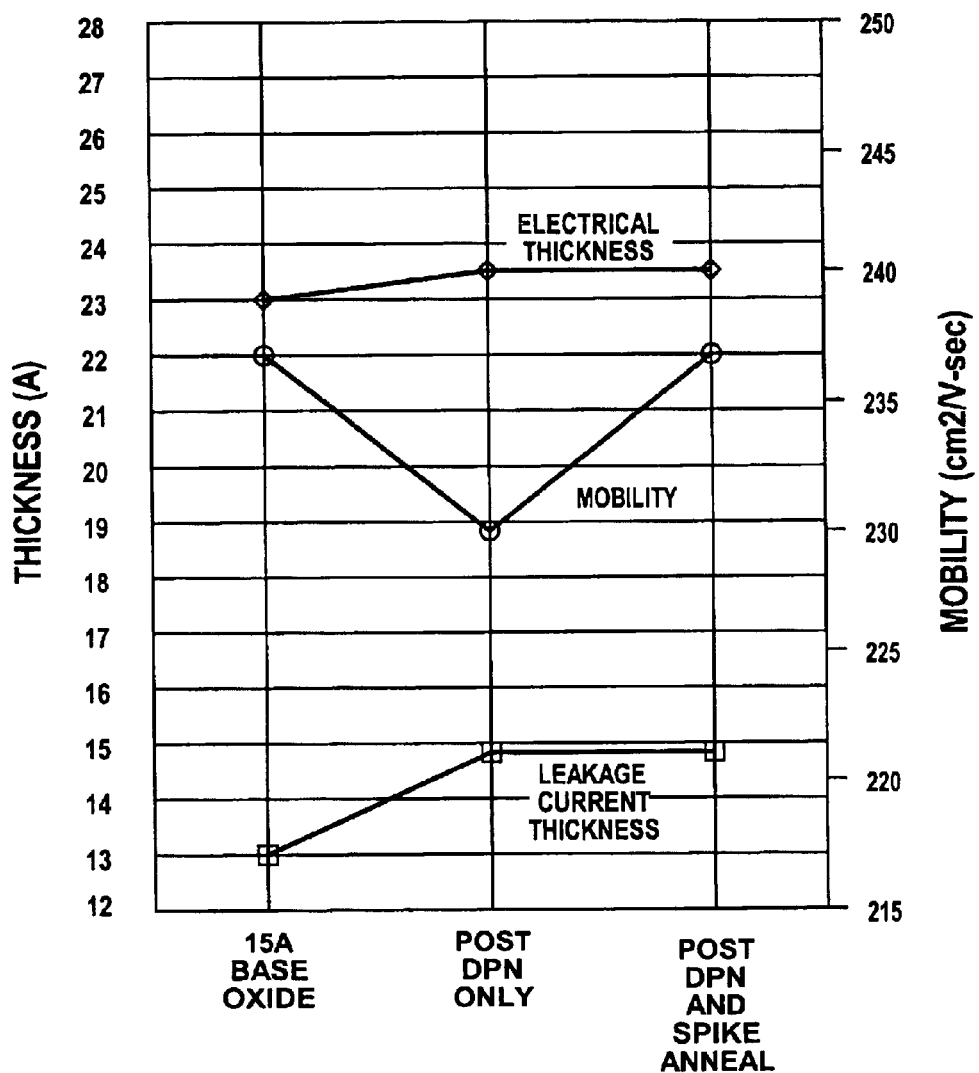
FIG. 11 is a plot comparing leakage, mobility and electrical thickness at three steps in the fabrication of a gate dielectric according to the present invention.

FIG. 11 is a plot comparing leakage, mobility and electrical thickness at three steps in the fabrication of a gate dielectric according to the present invention. Leakage current thickness and electrical thickness are plotted on the thickness scale on the left of the plot. Leakage current thickness is defined as the equivalent $SiO_2$ thickness that would generate the leakage current of the identified dielectric. An increase in leakage current thickness corresponds to a decrease in leakage current. Mobility is plotted on the mobility scale on the right of the plot. Leakage, mobility and electric thickness are plotted for 3 cases, a 15 Å base oxide, the 15 Å base oxide after decoupled plasma nitridation (DPN) and the 15 Å base oxide after decoupled plasma nitridation (DPN) and a spike anneal. The DPN process increases the leakage current thickness from about 13 Å to just under 15 Å. A 2 Å increase corresponds to about a 40 times decrease in leakage current density. The spike anneal has no significant effect on the leakage current. The DPN process decreases the mobility from about 237 cm²/volt-second to about 230 cm²/volt-second. However, the spike anneal restores the mobility to about 237 cm²/volt-second. The DPN process increases the electrical thickness by about 0.5 Å. The electrical thickness is unchanged by the spike anneal. Thus, the mobility problem usually associated with $SiO_xN_y$ layers has been overcome by the present invention.

Figure 12:
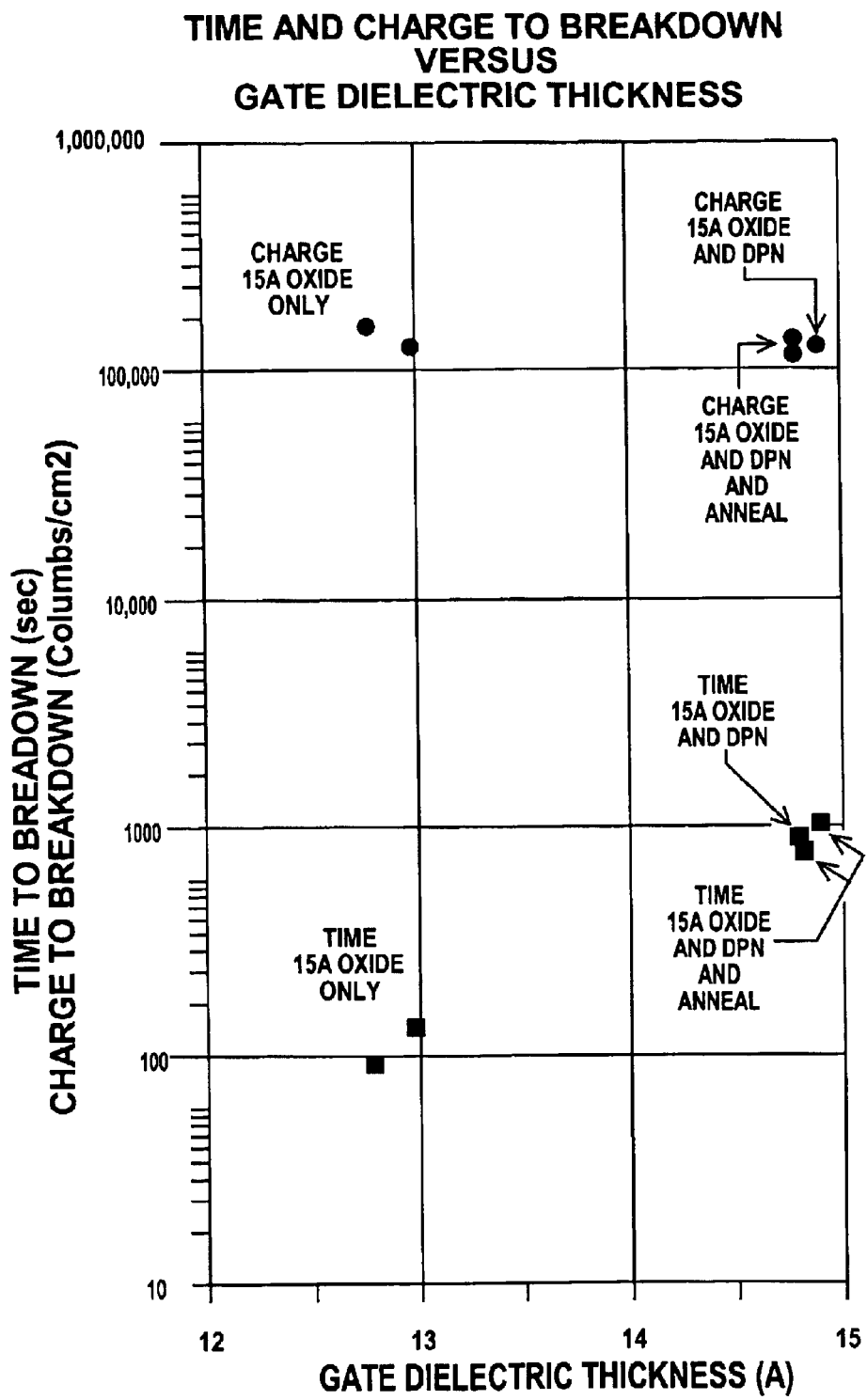
FIG. 12 is a plot comparing leakage, time to breakdown and charge to breakdown at three steps in the fabrication of a gate dielectric according to the present invention.

FIG. 12 is a plot comparing time to breakdown and charge to breakdown at three steps in the fabrication of a gate dielectric according to the present invention. Time to breakdown and charge to breakdown are plotted for a 15 Å base oxide, the 15 Å base oxide after a DPN and the 15 Å base oxide after a DPN and a spike anneal. Two samples are plotted for the 15 Å base oxide, one sample for the 15 Å base oxide after DPN and two samples for the 15 Å base oxide after a DPN and a spike anneal. The time to breakdown is about 120 seconds for a 15 Å base oxide and is about 990 seconds for a 15 Å base oxide after a DPN with or without a spike anneal. The charge to breakdown is about 0.75E5 columbs/cm² for a 15 Å base oxide and is about the same for 15 Å base oxide after a DPN with or without a spike anneal. Since for conventional plasma nitridation processes the $Q_{BD}$ is degraded and the $T_{BD}$ is unchanged, the present invention demonstrates the required reliability by way of sustaining the $Q_{BD}$ while increasing the $T_{BD}$ by about 10 fold.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed:

1. A method or fabricating a gate dielectric layer, comprising:

providing a substrate;

forming a silicon dioxide layer on a top surface of said substrate;

selecting a nitrogen flow rate in dependence upon a thickness of the silicon dioxide layer;

exposing said silicon dioxide layer to a plasma nitridation to convert said silicon dioxide layer into a silicon oxynitride layer; and performing a spiked rapid thermal anneal of said silicon oxynitride layer, wherein said exposing is performed using a decoupled plasma process; and wherein said exposing is performed using a flowing mixture of nitrogen and an inert gas such that the nitrogen flows at the nitrogen flow rate.

2. The method of claim 1, wherein said silicon dioxide layer has a thickness of 20 Å or less.

3. The method of claim 1, wherein said performing a spiked rapid thermal anneal includes reaching a maximum temperature of between 800 and 1300° C. and maintaining said maximum temperature for between 0 and 60 seconds.

4. The method of claim 1, wherein said substrate includes a bulk silicon or silicon on a insulator substrate and said forming a silicon dioxide layer is formed by a process selected from the group consisting of thermal oxidation, rapid thermal oxidation and chemical vapor deposition.

5. The method of claim 1, wherein said silicon oxynitride film contains between 5 and 15% nitrogen atoms.

6. The method of claim 1, wherein said silicon dioxide layer contains between 0 and 5 atomic percent nitrogen before said exposing said silicon dioxide layer to a plasma nitridation to convert said silicon dioxide layer into a silicon oxynitride layer.

7. The method of claim 1, wherein said silicon dioxide nitride layer is less than 23 Å thick.

8. The method of claim 1, wherein the concentration of nitrogen in said silicon oxynitride layer is between 1E21 and 5E21 atm/$cm^3$.

9. A method of fabricating a MOSFET, comprising:

providing a silicon substrate;

forming a silcon dioxide layer on a top surface of said silicon substrate;

selecting a nitrogen flow rate in dependence upon a thickness of the silicon dioxide layer;

exposing said silicon dioxide layer to a plasma nitridation to convert said silicon dioxide layer to a silicon oxynitride layer;

performing a spiked rapid thermal anneal of said silicon oxynitride layer;

forming a polysilicon gate on said anneal silicon oxynitride layer aligned over a channel region in said silicon substrate; and forming source/drain regions in said silicon substrate, and source drain regions aligned to said polysilicon gate, wherein said exposing is performed using a decoupled plasma process; and wherein said exposing is performed using a flowing mixture of nitrogen and an inert gas such that the nitrogen flows at the nitrogen flow rate.

10. The method of claim 9, wherein said silicon dioxide layer has a thickness of 20 Å or less.

11. The method of claim 9 wherein said performing a spiked rapid thermal anneal includes reaching a maximum temperature of between 800 and 1300° C. and maintaining said maximum temperature for between 0 and 60 seconds.

12. The method of claim 9, wherein said substrate is a bulk silicon substrate or silicon on insulator substrate and said forming a silicon dioxide layer is formed by a process selected from the group consisting of thermal oxidation, rapid thermal oxidation and chemical vapor deposition.

13. The method of claim 9 wherein said polysilicon gate is between 1000 and 2000 Å thick.

14. The method of claim 9, wherein said silicon dioxide layer contains between 0 and 5 atomic percent nitrogen before said exposing said silicon dioxide layer to a plasma nitridation to convert said silicon dioxide layer into a silicon oxynitride layer.

15. The method of claim 9, wherein said silicon dioxide nitride layer is less then 23 Å thick.

16. The method of claim 9, wherein the concentration of nitrogen in said silicon oxynitride layer is between 1E21 and 5E21 atm/$cm^3$.

17. The method of claim 1, further comprising selecting an inert gas flow rate in dependence upon the thickness of the silicon dioxide layer, wherein during said exposing the inert gas flows or the inert gas flow rate.

18. The method of claim 17, further comprising selecting a power level for the decoupled plasma process in dependence upon the thickness of the silicon dioxide layer, wherein said exposing is performed using the decoupled plasma process power level.

19. The method of claim 1, further comprising selecting a power level for the decoupled plasma process in dependence upon the thickness of the silicon dioxide layer, wherein said exposing is performed using the decoupled plasma process power level.

20. The method of claim 9, further comprising selecting an inert gas flow rate in dependence upon the thickness of the silicon dioxide layer, wherein during said exposing the inert gas flows at the inert gas flow rate.

21. The method of claim 20, further comprising selecting a power level for the decoupled plasma process in dependence upon the thickness of the silicon dioxide layer, wherein said exposing is performed using the decoupled plasma process power level.

22. The method of claim 9, further comprising selecting a power level for the decoupled plasma process in dependence upon the thickness of the silicon dioxide layer, wherein said exposing is performed using the decoupled plasma process power level.

* * * * *